(12) United States Patent
Otsuka

(10) Patent No.: US 6,822,921 B2
(45) Date of Patent: Nov. 23, 2004

(54) SEMICONDUCTOR DEVICE HAVING SEMICONDUCTOR MEMORY

(75) Inventor: Masayuki Otsuka, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 18 days.

(21) Appl. No.: 10/421,862

(22) Filed: Apr. 24, 2003

(65) Prior Publication Data

US 2003/0223302 A1 Dec. 4, 2003

(30) Foreign Application Priority Data

Jun. 4, 2002 (JP) ........................................ 2002-162839
Dec. 17, 2002 (JP) ........................................ 2002-365300

(51) Int. Cl.$^7$ ................................................. G11C 7/00
(52) U.S. Cl. ................................. 365/226; 365/189.11
(58) Field of Search ............................ 365/226, 189.11, 365/63, 185.23

(56) References Cited

U.S. PATENT DOCUMENTS

| 5,329,168 | A | * | 7/1994 | Sugibayashi et al. | ....... 327/535 |
|---|---|---|---|---|---|
| 5,363,333 | A | * | 11/1994 | Tsujimoto | .................. 365/201 |
| 5,805,519 | A | * | 9/1998 | Tomishima | ................. 365/226 |
| 6,449,192 | B2 | | 9/2002 | Otsuka | .................. 365/185.23 |
| 6,493,282 | B2 | * | 12/2002 | Iida et al. | ................... 365/226 |

FOREIGN PATENT DOCUMENTS

JP        11-176181        2/1999

* cited by examiner

*Primary Examiner*—Tan T. Nguyen
(74) *Attorney, Agent, or Firm*—Volentine Francos & Whitt, PLLC

(57) ABSTRACT

A semiconductor device includes first and second semiconductor chips encapsulated in a package. The first semiconductor chip includes a semiconductor memory having a general source pad and a word line-dedicated source pad. The second semiconductor chip has a step-down circuit for supplying a first potential to the general source pad of the first semiconductor chip. The step-down circuit supplies a second potential higher than the first potential to the word line-dedicated source pad of the first semiconductor chip.

20 Claims, 5 Drawing Sheets

SEMICONDUCTOR DEVICE HAVING SEMICONDUCTOR MEMORY

BACKGROUND OF THE INVENTION

The present invention relates to a semiconductor device, and particularly to a semiconductor device having a step-down circuit employed in a read only memory (ROM) encapsulated in a multi-chip package (MCP).

A ROM packaged or encapsulated in a conventional MCP is equipped with a custom chip wherein a logic circuit and a step-down circuit customized to suit user specs are provided on such a general-purpose ROM chip as described in FIG. 1 of the U.S. Pat. No. 6,449,192. Since the size of the custom chip is subjected to constraints of MCP packaging, the chip size becomes larger than an actual circuit scale and hence a lot of empty spaces exist.

As the step-down circuit, there is known one described in FIG. 1 of the U.S. patent application Ser. No. 10/243,644 filed by the present applicant. The disclosed circuit generates a desired internal source or power supply voltage lower than a source voltage. The internal source voltage produced by the step-down circuit is supplied as a power supply for a general-purpose ROM chip through a bonding wire.

The internal source voltage is often used in common with a circuit for supplying a memory cell's drain voltage corresponding to a DC current component, a memory cell and a sense amplifier together with word line control of a general-purpose ROM. There may be a case in which the sharing of such an internal source voltage causes a reduction in internal source voltage, thus leading to a malfunction.

In order to solve such a problem, there is provided Japanese Patent Application Laid-Open No. Hei 11(1999) 176181 which discloses that a plurality of internal power-supply generating step-down circuits are provided and supply internal power supplies independently respectively. Here, the voltages of the independent internal power supplies are the same.

In the above-described configuration, however, a problem arises in that an access speed becomes slow if the level of each internal source voltage is lowered to reduce current consumption, whereas if the level of each internal source voltage is raised to increase the access speed, then current consumption increases.

SUMMARY OF THE INVENTION

The present invention aims to provide means wherein a word line-dedicated source electrode is provided in a general-purpose ROM chip, and a step-down circuit dedicated to a word line (hereinafter called "word line-dedicated step-down circuit") and a step-down circuit excluding the word line (hereafter called "general step-down circuit") are provided and respectively set to independent potential levels to thereby make compatible a current consumption reduction and an access speed.

The present invention provides a semiconductor device comprising a first semiconductor chip equipped with a semiconductor memory and a second semiconductor chip having a step-down circuit both of which are encapsulated, wherein the first semiconductor chip has a general source pad and a word line-dedicated source pad, and the step-down circuit supplies a first potential to the general source pad and supplies a second potential higher than the first potential to the word line-dedicated source pad.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
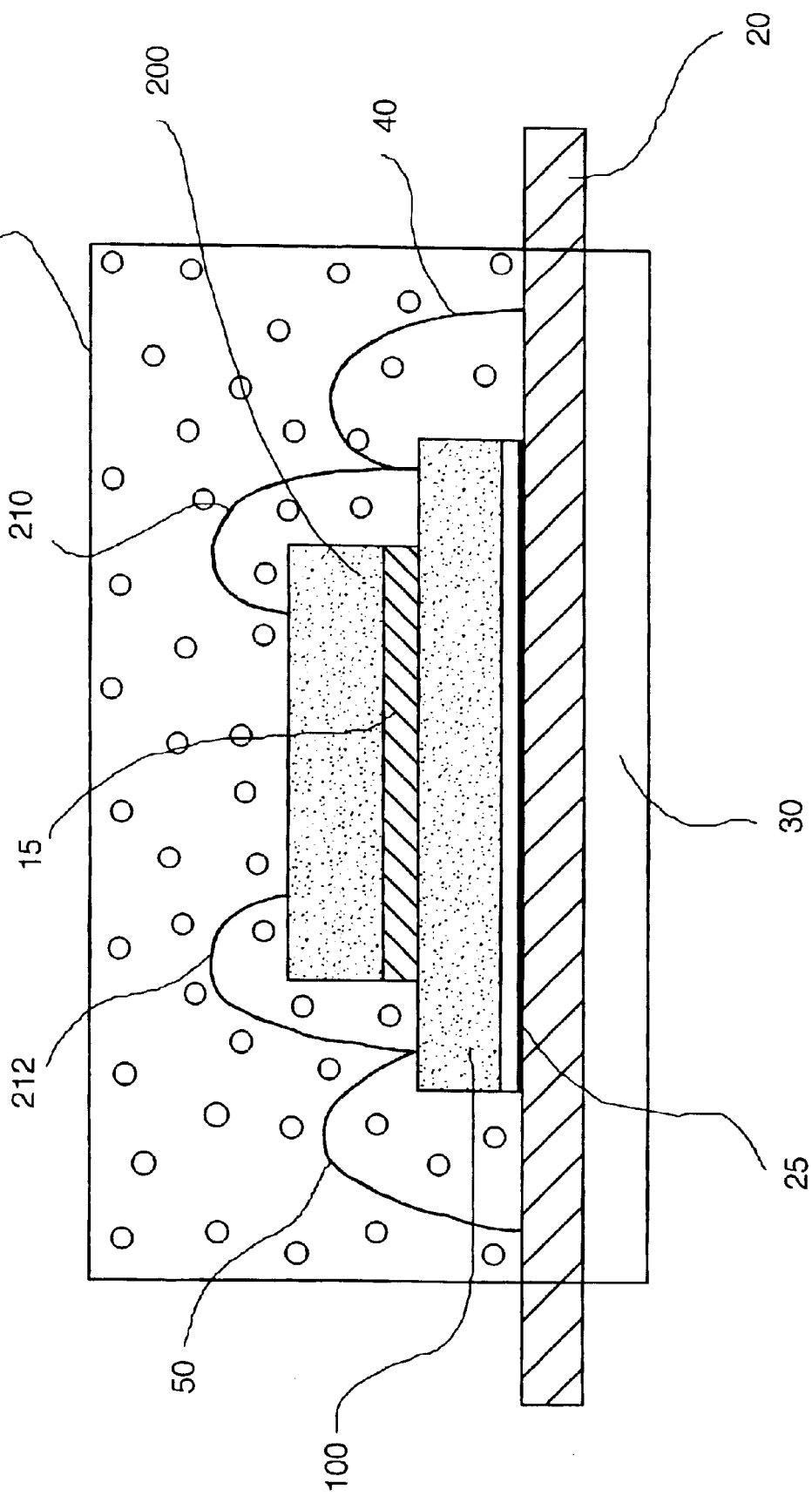
FIG. 1 is a cross sectional view showing the present invention.

The semiconductor device of the present invention is shown in FIG. 1. The semiconductor device 10 includes a general-purpose ROM chip 100 and a custom chip 200. The custom chip 200 is mounted on the general-purpose ROM chip 100 via paste 15. As described below, the general-purpose ROM chip 100 and the custom chip 200 are electrically connected by bonding wires 210 and 212. The general-purpose ROM chip 100 is mounted on the lead frame 20 via paste 25. The lead frame 20 may be replaced by a printed board or a conductive layer. The general-purpose ROM chip 100 is electrically connected to the lead frame by bonding wires 40 and 50. The semiconductor device 10 is molded by resin 30.

Figure 2:
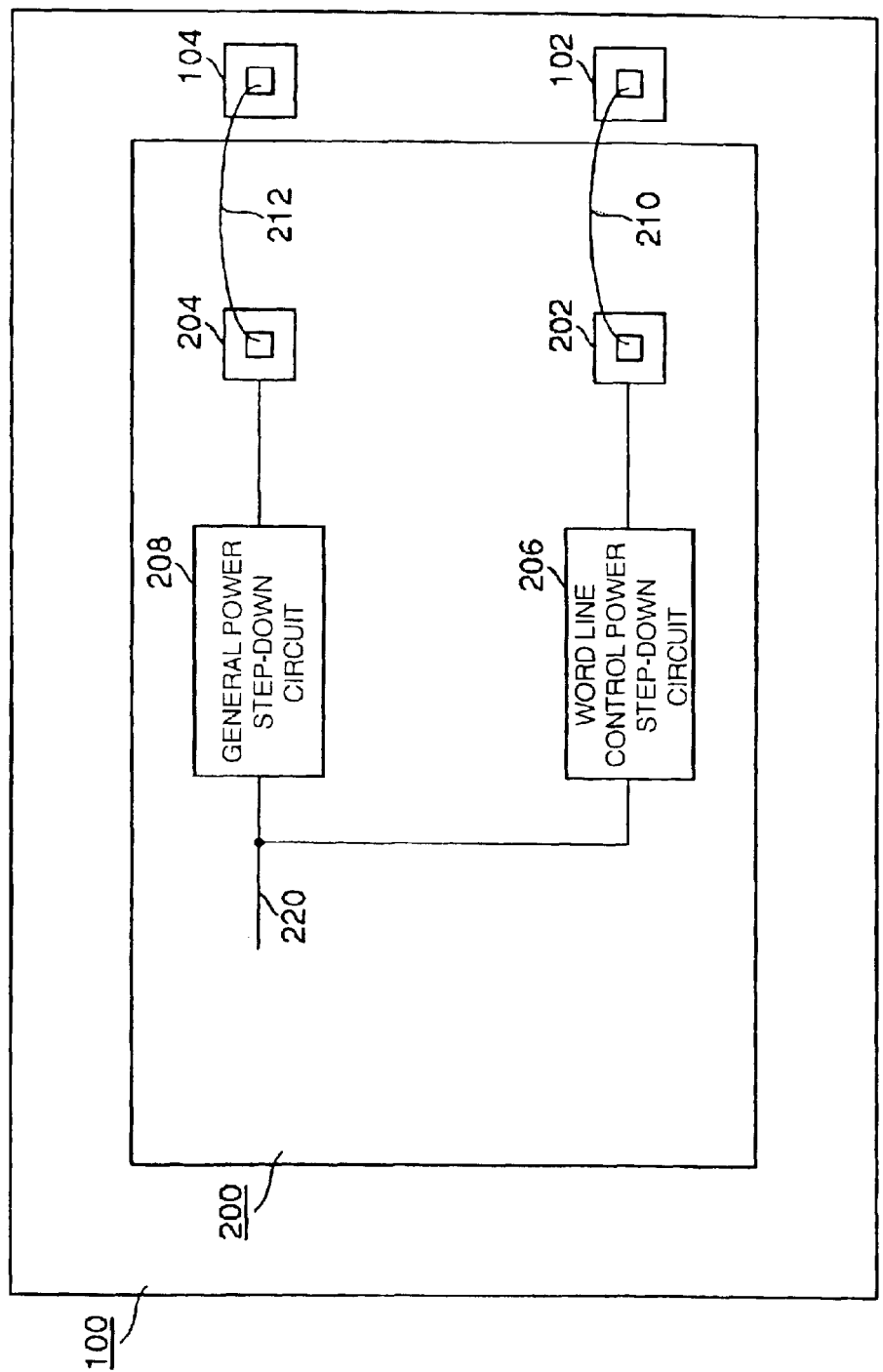
FIG. 2 is a circuit block diagram showing a first embodiment of the present invention.

FIG. 2 is a circuit block diagram showing a first embodiment of the present invention. The general-purpose ROM chip 100 has a word line control source pad 102 and a general source pad 104. The word line control source pad 102 is connected to an unillustrated word line control circuit such as a word line drive circuit or the like. A power supply or source supplied from the word line control source pad 102 is supplied to the word line control circuit. On the other hand, the general source pad 104 is connected to a circuit other than the word line control circuit, such as an unillustrated sense amplifier or the like. The power supply received by the general source pad 104 is supplied to all circuits in the general-purpose ROM chip 100, other than the word line control circuit.

The custom chip 200 mounted on the general-purpose ROM chip 100 is provided with a word line control source supply pad 202, a general source supply pad 204, a word line control power step-down circuit 206 and a general power step-down circuit 208. Each of the word line control power step-down circuit 206 and the general power step-down circuit 208 is provided with an unillustrated trimming circuit, which makes it possible to adjust a potential level.

The word line control source supply pad 202 is connected to the word line control power step-down circuit 206 inside the custom chip 200 and even to the word line control source pad 102 of the general-purpose ROM chip 100 by a bonding wire 210. A word line control power supply generated by the word line control power step-down circuit 206 is supplied to the word line control circuit lying within the general-purpose ROM chip 100 through the word line control source supply pad 202 and the word line control source pad 102.

On the other hand, the general source supply pad 204 is connected to the general power step-down circuit 208 inside the custom chip 200 and even to the general source pad 104 of the general-purpose ROM chip by a bonding wire 212. A general power supply produced by the general power step-down circuit 208 is supplied to all the circuits other than the word line control circuit in the general-purpose ROM chip 100 through the general source supply pad 204 and the general source pad 104.

The word line control power step-down circuit 206 and the general power step-down circuit 208 are respectively supplied with a control signal 220. The control signal 220 is of a signal which goes "H" when active and goes "L" during standby.

In general, a reduction in power consumption is required of the general-purpose ROM, which is driven by a power supply of about 3.3V. A demand for a further reduction in power consumption has been put forward in the present embodiment. The general source or power supply is set to about 2.6V, and the word line control power supply is set to about 2.8V slightly higher than the general power supply.

The operation of a step-down circuit according to the first embodiment of the present invention will next be described using FIG. 2.

The general source pad 104 is supplied with a potential (hereinafter called "general-purpose potential") produced from the general power step-down circuit 208 through the general source supply pad 204 and the bonding wire 212. Since the control signal 220 is of "H" in an active state, the general power step-down circuit 208 is also brought to an active state. Thus, the general source pad 104 is capable of momentarily responding to a variation in the general-purpose potential. On the other hand, since the control signal 220 is "L" in a standby state, the general power step-down circuit 208 is also brought to a standby state so that a reduction in power consumption is achieved.

The word line control source pad 102 is supplied with a potential (called "control potential") produced from the word line control power step-down circuit 206 through the word line control source supply pad 202 and the bonding wire 210. Since the control signal 220 is of "H" in the active state, the word line control power step-down circuit 206 is also held in the active state. Accordingly, the word line control source pad 102 is capable of momentarily responding to a variation in the control potential. On the other hand, since the control signal 220 is "L" in the standby state, the word line control power step-down circuit 206 is also brought to the standby state so that low power consumption is achieved.

Since the general power step-down circuit 208 and the word line control power step-down circuit 206 are respectively of step-down circuits each equipped with the trimming circuit and capable of adjusting the potential level, the levels of the general-purpose potential and control potential can be set independently.

According to the first embodiment of the present invention as described above, source pads for a first semiconductor chip are divided into two, and a control potential is set to a normal source potential or less of the first semiconductor chip, and a general-purpose potential is set to a value lower than the control potential. Thus, other circuits can be operated at a potential level lower than a potential level supplied to a word line control circuit.

From the above description, the problem that an access speed becomes slow if the level of the control potential is lowered to reduce current consumption, can be solved.

Further, circuits other than the word line control circuit are capable of achieving low power consumption regardless of the problem associated with the access speed.

Figure 3:
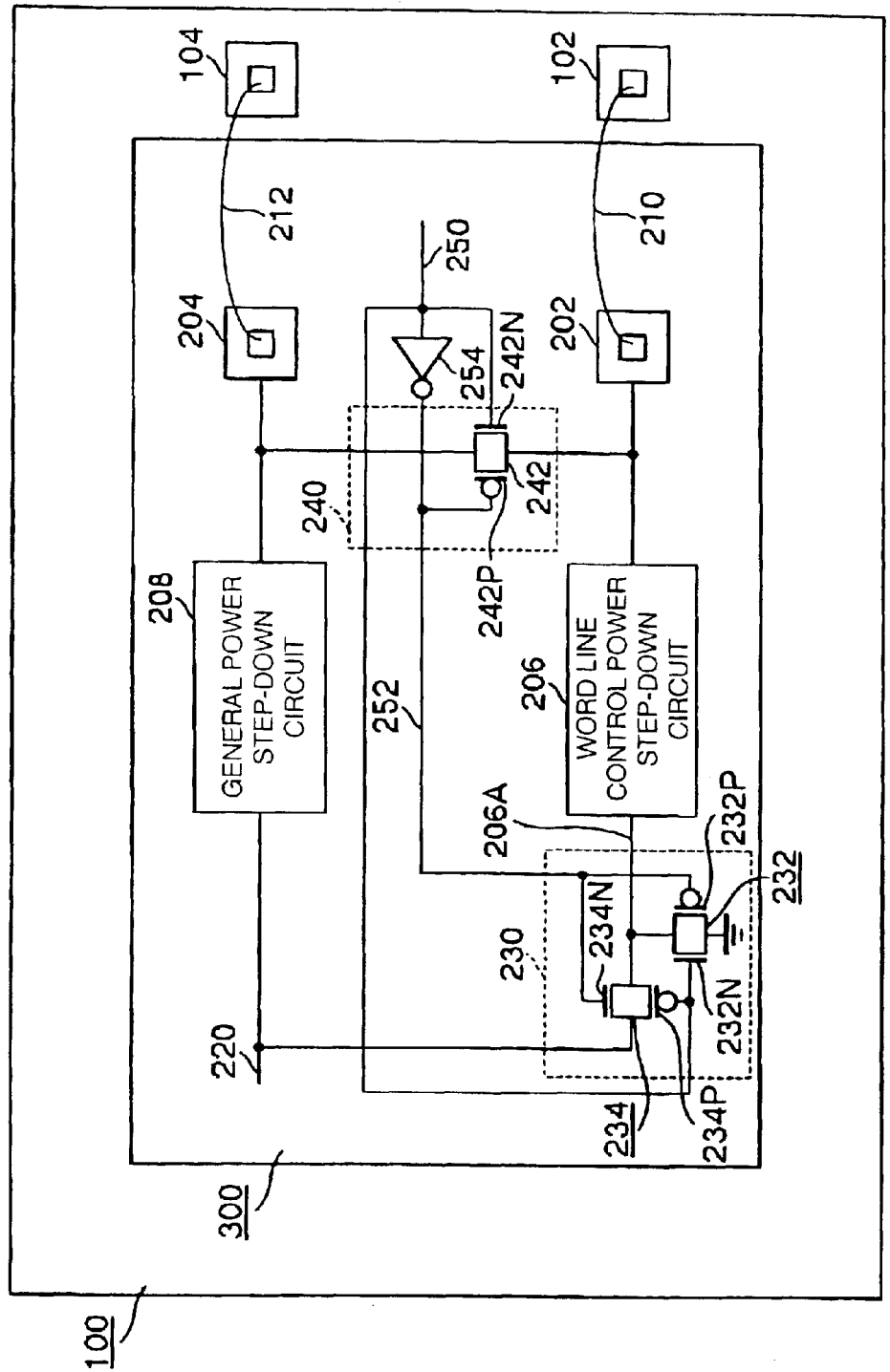
FIG. 3 is a circuit block diagram illustrating a second embodiment of the present invention.

FIG. 3 is a circuit block diagram showing a second embodiment of the present invention. Incidentally, the same elements in FIG. 3 as those shown in FIG. 2 are respectively identified by the same reference numerals and their description will therefore be omitted.

The second embodiment has a configuration in which control circuits are added to the control according to the first embodiment. In the first embodiment, the word line control power step-down circuit 206 provided in the custom chip 200 has received the control signal 220 therein along with the general power step-down circuit 208. In the second embodiment, however, a word line control power step-down circuit 206 provided in a custom chip 300 receives a control signal 220 therein through a first control circuit 230. In the first embodiment as well, the word line control source supply pad 202 and the general source supply pad 204 have been provided electrically independent of each other. In the second embodiment, however, a word line control source supply pad 202 and a general source supply pad 204 are connected to each other through a second control circuit 240.

The first control circuit 230 has first and second transfer gates 232 and 234. The first transfer gate 232 is connected between a control input terminal 206A of the word line control power step-down circuit 206 and ground. The second transfer gate 234 is connected to the control input terminal 206A of the word line control power step-down circuit 206 and controls the input of the control signal 220 to the word line control power step-down circuit 206. The first and second transfer gates 232 and 234 are controlled by complementary signals. Namely, an NMOS transistor 232N constituting the first transfer gate 232 and a PMOS transistor 234P constituting the second transfer gate 234 are respectively inputted with the same signal (first signal 250), whereas a PMOS transistor 232P constituting the first transfer gate 232 and an NMOS transistor 234N constituting the second transfer gate 234 are respectively inputted with a complementary signal 252 based on the first signal.

The second control circuit 240 has a third transfer gate 242 connected between the word line control source supply pad 202 and the general source supply pad 204. An NMOS transistor 242N constituting a third transfer gate is controlled by the first signal 250, and a PMOS transistor 242P is controlled by the complementary signal 252. Incidentally, an inverter 254 generates the complementary signal 252 from the first signal 250. Incidentally, the first signal 250 is a signal capable of selecting "H" or "L".

The operation of a step-down circuit according to the second embodiment of the present invention will next be described using FIG. 3.

In the second embodiment, when the first signal 250 is "L", the level of a potential at a general source pad 104 is set so as to take a general-purpose potential, and the level of a potential at the word line control source supply pad 202 is set so as to take a control potential. When the first signal 250 is taken "H", the word line control power step-down circuit 206 is brought to a standby state, and the potential levels of the general source supply pad 204 and the word line control source supply pad 202 are respectively brought to a general-purpose potential. Such a setting will be described in more detail.

When the first signal 250 is taken "L", the inverter 254 outputs "H". Thus, the first transfer gate 232 and the third transfer gate 242 are respectively brought to an OFF state, and the second transfer gate 234 is brought to an ON state. Accordingly, the general source supply pad 204 and the word-line control source supply pad 202 are electrically disconnected from each other, and the control input terminal 206A of the word line control power step-down circuit 206 is inputted with the control signal 220. Since the control signal 220 is of "H" in an active state, a general power step-down circuit 208 and the word line control power step-down circuit 206 are both brought to an active state. Further, the level of a potential at the general source supply pad 204 is brought to a general-purpose potential, and the level of a potential at the word line control source supply pat 202 is brought to a control potential. Incidentally, the word line control source pad 102 and the general source pad 104 in the general-purpose ROM chip 100 are respectively supplied with the general-purpose potential and the control potential through the bonding wires 210 and 212. Since the control signal 220 is "L" in the standby state, the general power step-down circuit 208 and the word line control power step-down circuit 206 are both brought to the standby state, and the levels of potentials at the general source supply pad 204 and the word line control source supply pad 202 are respectively brought to a low potential set in the standby state. Since the general power step-down circuit 208 and the word line control power step-down circuit 206 are respectively of step-down circuits each equipped with a trimming circuit and capable of adjusting the potential level as described above, the levels of the general-purpose potential and the control potential can be set independently.

On the other hand, when the first signal 250 is taken "H", the inverter 254 outputs "L". Thus, the first transfer gate 232 and the third transfer gate 242 are respectively brought to an ON state, and the second transfer gate 234 is brought to an OFF state. Consequently, the general source supply pad 204 and the word line control source supply pad 202 are electrically connected to each other, and the control input terminal 206A of the word line control power step-down circuit 206 is placed through the first transfer gate 232. Therefore, the word line control power step-down circuit 206 is brought to a state of being inputted with a signal of an "μL" level. Since the second transfer gate 234 is in the OFF state though the control signal 220 is "H" in the active state, the word line control power step-down circuit 206 is brought to the standby state and only the general power step-down circuit 208 is brought to the active state. Accordingly, the potential levels of the general source supply pad 204 and the word line control source supply pad 202 are respectively brought to a general-purpose potential. When the control signal 220 is "L" in the standby state, the general power step-down circuit 208 and the word line control power step-down circuit 206 are both brought to the standby state, and the potential levels of the general source supply pad 204 and the word line control source supply pad 202 respectively reach a low potential set in the standby state.

According to the second embodiment of the present invention as described above, if the control signal 220 is set to "L", then the potential level of the general source pad 104 in the general-purpose ROM chip 100 is brought to the general-purpose potential and the potential level of the word line control source pad 102 is brought to the control potential, thus making it possible to set the potential levels respectively independent of each other. This enables a solution of the problem that if the level of the general-purpose potential is lowered for the purpose of a reduction in current consumption, then an access speed becomes slow, whereas if the level thereof is raised for the purpose of an increase in the access speed, then current consumption increases.

If the control signal 220 is set to "H", then the potential levels of the general source pad 104 and word line control source pad 102 in the general-purpose ROM chip 100 can be both set so as to take a general-purpose potential.

The step-down circuit according to the second embodiment of the present invention is capable of selecting a mode using both the general-purpose potential and control potential, and a mode using only the general-purpose potential with respect to the setting of an internal power supply. Making an increase in alternative in this way enables flexible coping with a case in which the finish of each product is much different from an estimate at a design stage, and yields validity of short delivery-date development.

Figure 4:
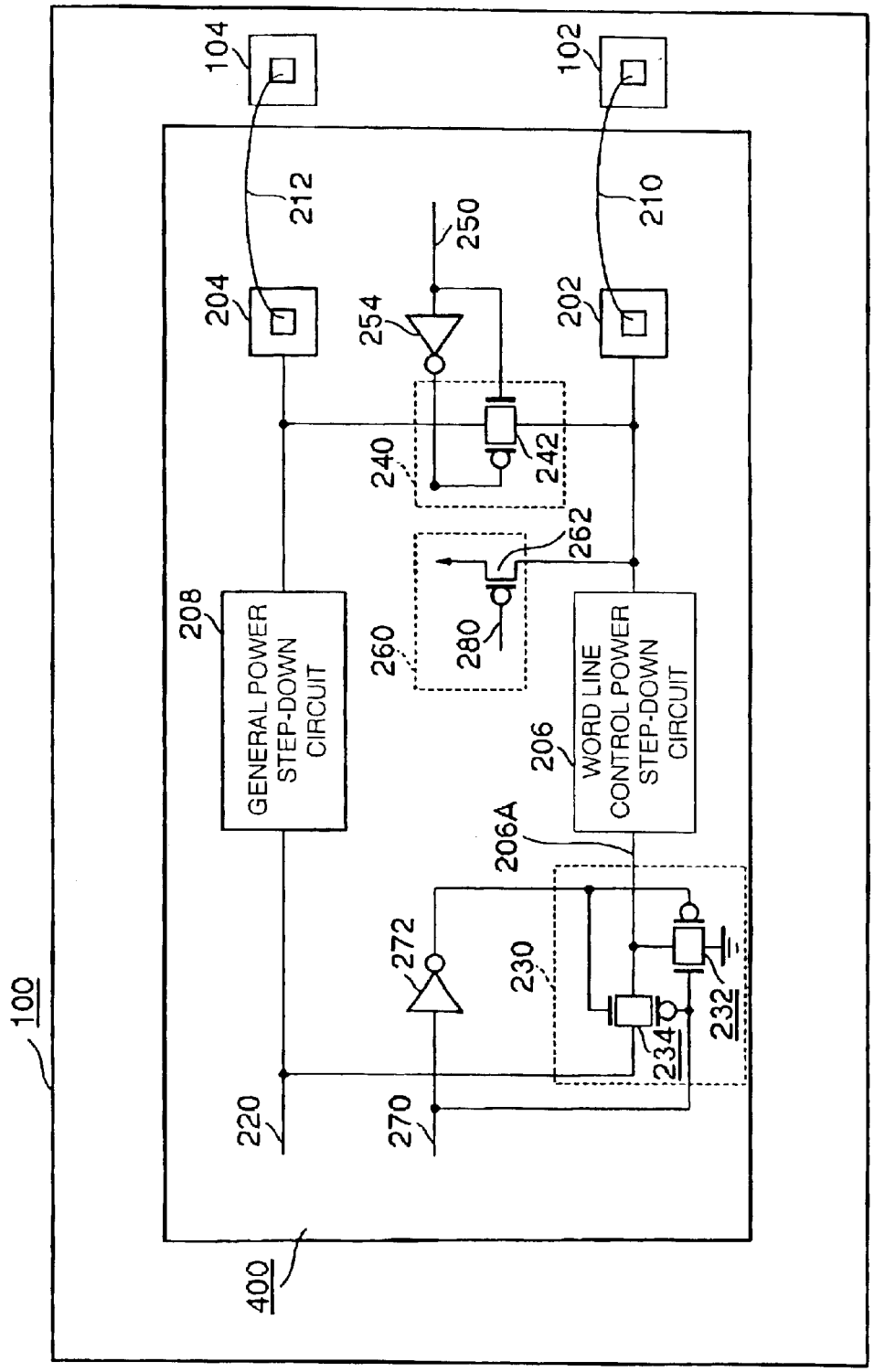
FIG. 4 is a circuit block diagram depicting a third embodiment of the present invention.

FIG. 4 is a circuit block diagram showing a third embodiment of the present invention. Incidentally, the same elements in FIG. 4 as those shown in FIG. 3 are respectively identified by the same reference numerals and their description will therefore be omitted.

The third embodiment has such a configuration that an external power supply circuit is added to the circuit according to the second embodiment, and control circuits are controlled by independent signals. In the second embodiment, the first control circuit 230 and the second control circuit 240 provided in the custom chip 300 have received the same signal (first signal) 250 therein. In the third embodiment, however, a first control circuit 230 provided in a custom chip 400 is controlled by a second signal 270 and a complementary signal inverted by an inverter 272. In the third embodiment as well, the external power supply circuit 260 is connected to the word line control source supply pad 202. The external power supply circuit 260 has a PMOS transistor 262 controlled by a third signal 280. Incidentally, each of the second signal 270 and the third signal 280 is capable of selecting "H" or "L" in a manner similar to the first signal 250.

The operation of a step-down circuit according to the third embodiment of the present invention will next be described using FIG. 4.

In the third embodiment, when the first signal 250 is "L", the second signal 270 is "L" and the third signal 280 is "H", the level of a potential at the general source supply pad 204 is set so as to take a general-purpose potential, and the level of a potential at the word line control source supply pad 202 is set so as to take a control potential. When the first signal 250 is "H", the second signal 270 is "H", and the third signal 280 is "H", the word line control power step-down circuit 206 is brought to a standby state, and hence the potential levels of the general source supply pad 204 and the word line control source supply pad 202 are respectively brought to a general-purpose potential. Further, when the first signal 250 is "L", the second signal 270 is "H" and the third signal 280 is "L", the potential level of the general source supply pad 204 is taken to a general-purpose potential, and the potential level of the word line control source supply pad 202 is brought to an external source potential (VDD). Such a setting will be explained in more detail.

A description will first be made of a case in which the first signal 250 is "L", the second signal 270 is "L" and the third signal 280 is "H". Since the first and second signals 250 and 270 are respectively "L", the inverters 254 and 272 output "H" respectively. Thus, the first transfer gate 232 and the third transfer gate 242 are respectively brought to an OFF state, and the second transfer gate 234 is brought to an ON state. Consequently, the general source supply pad 204 and the word line control source supply pad 202 are electrically disconnected from each other, and the control input terminal 206A of the word line control power step-down circuit 206 is inputted with a control signal 220. Incidentally, since the third signal 280 is "H", no external power supply is supplied from an external source (indicated by arrow in FIG. 3) to the word line control source supply pad 202. Since the control signal 220 is "H" in an active state, the general power step-down circuit 208 and the word line control power step-down circuit 206 are both brought to an active state, so that the level of a potential at the general source supply pad 204 is brought to a general-purpose potential, and the level of a potential at the word line control source supply pad 202 is brought to a control potential. Since the control signal 220 is "L" in a standby state, the general power step-down circuit 208 and the word line control power step-down circuit 206 are both brought to a standby state, so that the potential levels of the general source supply pad 204 and the word line control source supply pad 202 are respectively brought to a low potential set in the standby state. In the third embodiment, the word line control power step-down circuit 206 is set so as to reach a high impedance state in the standby state.

A description will next be made of a case in which the first signal 250 is "H", the second signal 270 is "H" and the third signal 280 is "H". Since the first and second signals 250 and 270 are respectively "H", the inverters 254 and 272 output "L" respectively. Thus, the first transfer gate 232 and the third transfer gate 242 are respectively brought to an ON state, and the second transfer gate 234 is brought to an OFF state. Consequently, the general source supply pad 204 and the word line control source supply pad 202 are electrically connected to each other, and the control input terminal 206A of the word line control power step-down circuit 206 is disposed through the first transfer gate 232. Therefore, the word line control power step-down circuit 206 is brought into a state of being inputted with a signal of an "L" level. Incidentally, since the third signal 280 is "H", no external power supply is supplied from the external source (indicated by arrow in FIG. 3) to the word line control source supply pad 202. Since the second transfer gate 234 is in an OFF state though the control signal 220 is "H" in an active state, the word line control power step-down circuit 206 is brought to a standby state and only the general power step-down circuit 208 is brought to an active state. Thus, the potential levels of the general source pad 104 and the word line control source supply pad 202 are respectively brought to a general-purpose potential. Since the control signal 220 is "L" in the standby state, the general power step-down circuit 208 and the word line control power step-down circuit 206 are both brought to the standby state, so that the potential levels of the general source supply pad 204 and the word line control source supply pad 202 are respectively brought to a low potential set in the standby state.

A description will finally be made of a case in which the first signal 250 is "L", the second signal 270 is "H" and the third signal 280 is "L". Since the first signal 250 is "L" and the second signal 270 is "H", the inverter 254 outputs "H" and the inverter 272 outputs "L", respectively. Thus, the first transfer gate 232 is brought to an ON state, and the second transfer gate 234 and third transfer gate 242 are respectively brought to an OFF state. Consequently, the general source supply pad 204 and the word line control source supply pad 202 are electrically disconnected from each other, and the control input terminal 206A of the word line control power step-down circuit 206 is disposed through the first transfer gate 232. Therefore, the word line control power step-down circuit 206 is brought into a state of being inputted with a signal of an "L" level. Since the second transfer gate 234 is in an OFF state though the control signal 220 is "H" in an active state, the word line control power step-down circuit 206 is brought to a standby state and only the general power step-down circuit 208 is brought to an active state. Incidentally, since the third signal 280 is "L", the transistor 262 of the external power supply circuit 260 is brought to an ON state so that an external power supply is supplied from the external power supply circuit 260 to the word line control source supply pad 202. Thus, the level of a potential at the general source pad 104 reaches a general-purpose potential, and the level of a potential at the word line control source supply pad 202 is brought to an external source potential. Since the control signal 220 is "L" in the standby state, the general power step-down circuit 208 and the word line control power step-down circuit 206 are both brought to the standby state, so that the potential levels of the general source supply pad 204 and the word line control source supply pad 202 are respectively brought to a low potential set in the standby state.

According to the third embodiment of the present invention as described above, such a mode that the potential level of the general source pad 104 in the general-purpose ROM chip 100 reaches the general-purpose potential and the potential level of the word line control source pad 102 is brought to the external source potential, can be set in addition to the two modes described in the second embodiment. Accordingly, the mode using both the general-purpose potential and control potential, the mode using only the general-purpose potential and the mode using the general-purpose potential and the external source potential can be selected with respect to the setting of an internal power supply. Making an increase in alternative in this way enables flexible coping with a case in which the finish of each product is much different from an estimate at a design stage, and yields validity of short delivery-date development.

Figure 5:
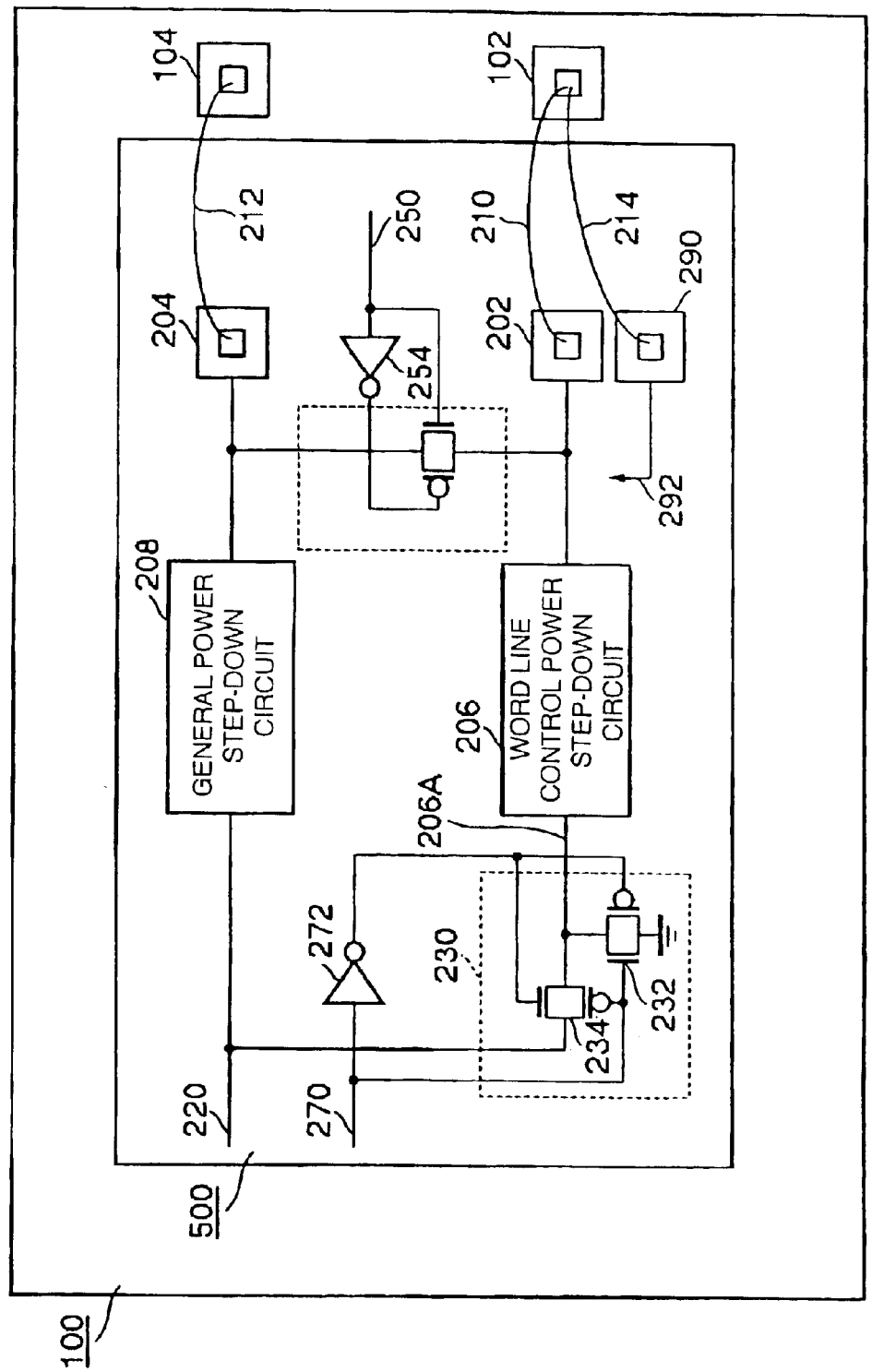
FIG. 5 is a circuit block diagram showing a fourth embodiment of the present invention.

FIG. 5 is a circuit block diagram showing a fourth embodiment of the present invention. Incidentally, the same elements in FIG. 5 as those shown in FIG. 4 are respectively identified by the same reference numerals and their description will therefore be omitted.

In the fourth embodiment, the external power supply circuit in the circuit of the third embodiment is omitted and an external source pad is added to the custom chip. In the fourth embodiment, an external source pad 290 provided in a custom chip 500 is connected to an external source or power supply 292. A word line control source supply pad 102 of a general-purpose ROM chip 100 is selectively connected to its corresponding word line control source supply pad 202 or external source pad 290 of the custom chip 500 by a bonding wire 210 or 214. Namely, the word line control source supply of the general-purpose ROM chip 100 is determined by wire bonding option.

The operation of a step-down circuit according to the fourth embodiment of the present invention will next be described using FIG. 5.

In the fourth embodiment, when a first signal 250 is "L", a second signal 270 is "L", and the word line control source supply pad 202 is connected to the word line control source supply pad 102 by the bonding wire 210, the level of a potential at a general source supply pad 204 is set so as to take a general-purpose potential, the level of a potential at the word line control source supply pad 202 is set so as to reach a control potential, and the general source pad 104 and word line control source supply pad 102 of the general-purpose ROM chip 100 are respectively set so as to be supplied with the general-purpose potential and control potential. When the first signal 250 is "H", the second signal 270 is "H", and the word line control source supply pad 202 is connected to the word line control source supply pad 102 by the bonding wire 210, a word line control power step-down circuit 206 is brought to a standby state so that the potential levels of the general source supply pad 204 and word line control source supply pad 202 are respectively brought to a general-purpose potential. Therefore, the general-purpose potential is supplied to the general source pad 104 and word line control source supply pad 102 of the general-purpose ROM chip 100. Further, when the first signal 250 is "L", the second signal 270 is "H" and the external source pad 290 is connected to the word line control source supply pad 102 by the bonding wire 214, the potential levels of the general source supply pad 204 and the general source pad 104 connected thereto, of the general-purpose ROM chip 100 are respectively taken to a general-purpose potential, and the potential level of the word line control source supply pad 102 of the general-purpose ROM chip 100 is brought to an external source potential (VDD). Such a setting will be explained in more detail.

A description will first be made of a case in which the first signal 250 is "L", the second signal 270 is "L" and the word line control source supply pad 202 is connected to the word line control source supply pad 102 by the bonding wire 210. Since the first and second signals 250 and 270 are respectively "L", inverters 254 and 272 output "H" respectively. Thus, a first transfer gate 232 and a third transfer gate 242 are respectively brought to an OFF state, and a second transfer gate 234 is brought to an ON state. Consequently, the general source supply pad 204 and the word line control source supply pad 202 are electrically disconnected from each other, and a control input terminal 206A of the word line control power step-down circuit 206 is inputted with a control signal 220. Since the control signal 220 is "H" in an active state, a general power step-down circuit 208 and the word line control power step-down circuit 206 are both brought to an active state, so that the potential level of the general source supply pad 204 is brought to a general-purpose potential, and the potential level of the word line control source supply pad 202 is brought to a control potential. Incidentally, since the word line control source supply pad 202 is connected to the word line control source supply pad 102 by the bonding wire 210, the control potential is supplied even to the word line control source supply pad 102 of the general-purpose ROM chip 100. Since the control signal 220 is "L" in a standby state, the general power step-down circuit 208 and the word line control power step-down circuit 206 are both brought to a standby state, so that the potential levels of the general source supply pad 204 and the word line control source supply pad 202 are respectively brought to a low potential set in the standby state. In the fourth embodiment, the word line control power step-down circuit 206 is set so as to reach a high impedance state in the standby state.

A description will next be made of a case in which the first signal 250 is "H", the second signal 210 is "H" and the word line control source supply pad 202 is connected to the word line control source supply pad 102 by the bonding wire 210. Since the first and second signals 250 and 270 are respectively "H", the inverters 254 and 272 output "L" respectively. Thus, the first transfer gate 232 and the third transfer gate 242 are respectively brought to an ON state, and the second transfer gate 234 is brought to an OFF state. Consequently, the general source supply pad 204 and the word line control source supply pad 202 are electrically connected to each other, and the control input terminal 206A of the word line control power step-down circuit 206 is disposed through the first transfer gate 232. Therefore, the word line control power step-down circuit 206 is brought into a state of being inputted with a signal of an "L" level. Since the second transfer gate 234 is in the OFF state even though the control signal 220 is "H" in the active state, the word line control power step-down circuit 206 is brought to a standby state, and only the general power step-down circuit 208 reaches an active state. Thus, the levels of potentials at the general source pad 104 and the word line control source supply pad 202 are respectively brought to a general-purpose potential. Incidentally, since the word line control source supply pad 202 is connected to the word line control source supply pad 102 by the bonding wire 210, the general-purpose potential is supplied even to the word line control source supply pad 102 of the general-purpose ROM chip 100. Since the control signal 220 is "L" in a standby state, the general power step-down circuit 208 and the word line control power step-down circuit 206 are both brought to a standby state, so that the potential levels of the general source supply pad 204 and the word line control source supply pad 202 are respectively brought to a low potential set in the standby state.

A description will finally be made of a case in which the first signal 250 is "L", the second signal 270 is "H" and the external source pad 290 is connected to the word line control source supply pad 102 by the bonding wire 214. Since the first signal 250 is "L" and the second signal 270 is "H", the inverter 254 outputs "H" and the inverter 272 outputs "L", respectively. Thus, the first transfer gate 232 is brought to an ON state, and the second transfer gate 234 and third transfer gate 242 are respectively brought to an OFF state. Consequently, the general source supply pad 204 and the word line control source supply pad 202 are electrically disconnected from each other, and the control input terminal 206A of the word line control power step-down circuit 206 is disposed through the first transfer gate 232. Therefore, the word line control power step-down circuit 206 is brought into a state of being inputted with a signal of an "L" level. Since the second transfer gate 234 is in an OFF state even though the control signal 220 is "H" in an active state, the word line control power step-down circuit 206 is brought to a standby state and only the general power step-down circuit 208 is brought to an active state. Incidentally, since the external source pad 290 is connected to the word line control source supply pad 102 by the bonding wire 214, the word line control source supply pad 102 is supplied with the external source potential from the external power supply 292. Thus, the level of a potential at the general source pad 104 of the general-purpose ROM chip 100 reaches a general-purpose potential, and the level of a potential at the word line control source supply pad 102 is brought to the external source potential. Since the control signal 220 is "L" in the standby state, the general power step-down circuit 208 and the word line control power step-down circuit 206 are both brought to the standby state, so that the potential levels of the general source pad 104 and the word line control source supply pad 102 are respectively brought to a low potential set in the standby state.

According to the fourth embodiment of the present invention as described above, the three modes described in the third embodiment can be set by the two control signals and wire bonding option.

While the aforementioned first through fourth embodiments have described the examples each applied to the general-purpose chip encapsulated in an MCP, the present invention can be also applied to packages other than the MCP.

In the second embodiment, the control circuits 230 and 240 having the transfer gates controlled by the first signal 250 have controlled the connection of the general source supply pad 204 and the word line control source supply pad 202, the connection of the control input terminal 206A of the word line control power step-down circuit 206 and the input line for the control signal 220, or the connection of the control input terminal 206A and the earth. However, the control circuits 230 and 240 may respectively have switching control circuits other than the transfer gates. Alternatively, the control of the connections by the control circuits 230 and 240 may be performed by metal option that the connections are selectively performed directly by wires.

While the first signal 250 employed in the second embodiment is of the signal settable to "H" or "L", the setting of "H" or "L" can be also realized by metal option, fuses or bonding option.

While the connection of the external power supply and the word line control source supply pad 202 has been controlled by the PMOS transistor 262 in addition to the application of the second embodiment in each of the third and fourth embodiments, it may be controlled by other switching control circuit or metal option.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:
a first semiconductor chip including a semiconductor memory having a general source pad and a word line-dedicated source pad; and
a second semiconductor chip having a step-down circuit for supplying a first potential to the general source pad of the first semiconductor chip, the step-down circuit supplying a second potential higher than the first potential to the word line-dedicated source pad of the first semiconductor chip,
wherein the first and second semiconductor chips are encapsulated in a package.

2. The semiconductor device according to claim 1, wherein the step-down circuit includes a general power step-down circuit for supplying the first potential and a word line-dedicated power step-down circuit for supplying the second potential.

3. The semiconductor device according to claim 2, wherein the general power step-down circuit and the word line-dedicated power step-down circuit are controlled by the same control signal.

4. The semiconductor device according to claim 2, wherein the general power step-down circuit and the word line-dedicated power step-down circuit are controlled by different control signals.

5. The semiconductor device according to claim 1, wherein the second semiconductor chip has a control circuit, and
the control circuit brings the general power step-down circuit and the word line-dedicated power step-down circuit to an operating state together in a first state, and electrically disconnects the general source pad and the word line-dedicated source pad from each other to supply the first and second potentials thereto, and
the control circuit brings the general power step-down circuit and the word line-dedicated power step-down circuit to an operating state and a non-operating state, respectively, in a second state, and electrically connects the general source pad and the word line-dedicated source pad to supply the first potential thereto.

6. The semiconductor device according to claim 5, wherein the control circuit further includes a third state and brings the general power step-down circuit and the word line-dedicated power step-down circuit to an operating state and a non-operating state, respectively in the third state, and electrically disconnects the general source pad and the word line-dedicated source pad from each other to supply the first potential to the general source pad and supply an external source potential to the word line-dedicated source pad.

7. The semiconductor device according to claim 1, wherein the second semiconductor chip has a first pad connected to the general power step-down circuit and a second pad connected to the word line-dedicated power step-down circuit, and the first and second pads are respectively connected to the general source pad and word line-dedicated source pad of the first semiconductor chip.

8. The semiconductor device according to claim 7, wherein the second semiconductor chip further includes a third pad connected to an external power supply, and the word line-dedicated source pad of the first semiconductor chip is selectively connected to the second or third pad.

9. A semiconductor device, comprising:
a semiconductor memory chip having a general source pad and a word line-dedicated source pad, the semiconductor memory chip includes a word line driver connected to the word line-dedicated source pad; and
a semiconductor custom chip mounted on the semiconductor memory chip, the semiconductor custom chip having a step-down circuit for supplying a first potential to the general source pad of the first semiconductor chip, the step-down circuit supplying a second potential higher than the first potential to the word line-dedicated source pad of the first semiconductor chip.

10. The semiconductor device according to claim 9, wherein the step-down circuit includes a general power step-down circuit for supplying the first potential and a word line-dedicated power step-down circuit for supplying the second potential.

11. The semiconductor device according to claim 10, wherein the general power step-down circuit and the word line-dedicated power step-down circuit are controlled by the same control signal.

12. The semiconductor device according to claim 10, wherein the general power step-down circuit and the word line-dedicated power step-down circuit are controlled by different control signals.

13. The semiconductor device according to claim 9, wherein the second semiconductor chip has a control circuit for bringing the general power step-down circuit and the word line-dedicated power step-down circuit to an operating state together in a first state, the control circuit electrically disconnecting the general source pad and the word line-dedicated source pad from each other to supply the first and second potentials thereto, and wherein the control circuit brings the general power step-down circuit and the word line-dedicated power step-down circuit to an operating state and a non-operating state, respectively, in a second state, and electrically connects the general source pad and the word line-dedicated source pad to supply the first potential thereto.

14. The semiconductor device according to claim 13, wherein the control circuit further includes a third state and brings the general power step-down circuit and the word line-dedicated power step-down circuit to an operating state and a non-operating state, respectively in the third state, and electrically disconnects the general source pad and the word line-dedicated source pad from each other to supply the first potential to the general source pad and supply an external source potential to the word line-dedicated source pad.

15. The semiconductor device according to claim 9, wherein the semiconductor custom chip has a first pad connected to the general power step-down circuit and a second pad connected to the word line-dedicated power step-down circuit, and the first and second pads are respectively connected to the general source pad and word line-dedicated source pad of the first semiconductor chip.

16. The semiconductor device according to claim 15, wherein the semiconductor custom chip further includes a third pad connected to an external power supply, and the word line-dedicated source pad of the first semiconductor chip is selectively connected to the second or third pad.

17. A semiconductor device, comprising:
 a semiconductor memory chip having a general source pad applied to a first potential and a word line-dedicated source pad applied to a second potential that is higher than the first potential, the semiconductor memory chip includes a plurality of word lines driven by the second potential and a plurality of circuits driven by the first potential; and
 a semiconductor custom chip mounted on the semiconductor memory chip, the semiconductor custom chip having a step-down circuit for supplying the first potential to the general source pad of the first semiconductor chip and the second potential to the word line-dedicated source pad of the first semiconductor chip.

18. The semiconductor device according to claim 17, wherein the step-down circuit includes a general power step-down circuit for supplying the first potential and a word line-dedicated power step-down circuit for supplying the second potential.

19. The semiconductor device according to claim 18, wherein the general power step-down circuit and the word line-dedicated power step-down circuit are controlled by the same control signal.

20. The semiconductor device according to claim 18, wherein the general power step-down circuit and the word line-dedicated power step-down circuit are controlled by different control signals.

* * * * *